United States Patent [19]

Ayata

[11] Patent Number: 4,634,876
[45] Date of Patent: Jan. 6, 1987

[54] OBJECT POSITION DETECTING APPARATUS USING ACCUMULATION TYPE SENSOR

[75] Inventor: Naoki Ayata, Machida, Japan

[73] Assignee: Canon Kabushiki Kaisha, Tokyo, Japan

[21] Appl. No.: 606,537

[22] Filed: May 3, 1984

[30] Foreign Application Priority Data

May 13, 1983 [JP] Japan .................................. 58-82789
Feb. 10, 1984 [JP] Japan .................................. 59-21896

[51] Int. Cl.$^4$ ............................................. G01N 21/86
[52] U.S. Cl. ................................... 250/548; 356/400; 250/561
[58] Field of Search ........ 250/548, 557, 561, 234-236; 356/399, 400, 401, 375; 350/6.1, 6.6-6.91

[56] References Cited

U.S. PATENT DOCUMENTS

| | | | |
|---|---|---|---|
| 4,275,306 | 6/1981 | Kato et al. | 250/548 |
| 4,311,389 | 1/1982 | Fay et al. | 250/548 |
| 4,549,084 | 10/1985 | Markle | 250/548 |

Primary Examiner—Edward P. Westin
Attorney, Agent, or Firm—Fitzpatrick, Cella, Harper & Scinto

[57] ABSTRACT

A device for detecting a position of an object including apparatus for producing a light beam, apparatus for scanningly deflecting the light beam with respect to the object, apparatus for sensing an image of the object resulting from the scan and accumulating information therefrom as an electric signal, apparatus for outputting the signal from the sensing and accumulating apparatus when the scan is complete, and apparatus for detecting the position of the object on the basis of the signal output from the sensing and accumulating apparatus.

7 Claims, 8 Drawing Figures

OBJECT POSITION DETECTING APPARATUS USING ACCUMULATION TYPE SENSOR

BACKGROUND OF THE INVENTION

1. Field of the Invention

The present invention relates to a device for detecting a position of an object and, more particularly, to a device for detecting a positional deviation or displacement between a photomask or reticle and a wafer in an alignment and exposure apparatus for manufacturing semiconductor circuits, or to a device for detecting a position of a semiconductor device relative to a machining apparatus or an inspecting apparatus.

2. Description of the Prior Art

In the field of manufacturing semiconductor circuits, the positions of an alignment mark formed on a mask, which will hereinafter be called a mask alignment mark, and an alignment mark formed on a wafer, which will hereinafter be called a wafer alignment mark, must be detected with high accuracy in order to precisely align the mask and wafer, prior to exposing the wafer to the semiconductor circuit pattern of the mask or reticle.

It is known in the prior art that, in order to bring the mask and the wafer into alignment with each other, the mask alignment mark and wafer alignment mark may be scanned with a laser beam to detect their positions. For example, U.S. Pat. No. 4,199,219 proposes that a light beam scans a mask and a wafer which are already roughly aligned, to scatter the light reflected by the alignment marks. The reflected light is sensed by a photodetector, so that the positions of the alignment marks are converted to time intervals of the photodetector outputs. This system requires that the laser beam scans the mask surface and the wafer surface, and more particularly the mask alignment mark at a constant speed and the wafer alignment mark. However, it is difficult to scan them at a constant speed because each of the plural mirror surfaces of a polygonal mirror has to be positioned extremely accurately, and also because there is an unavoidable non-uniformity in the polygonal mirror rotation. This results in a measurement error in the positions of the mask alignment mark and wafer alignment mark.

U.S. Pat. No. 4,262,208, which has been assigned to the assignee of the present application, proposes a device which is capable of detecting a position without using scanning means. Even in such a system, however, when the intensity of the light reflected by the wafer, particularly the defracted light from the marks, is not high enough, the level of the light signal is so low that the position thereof is not detected.

Further, a recent trend in semiconductor manufacturing causes the reflected light signal level to be too low to detect the mark position (1) because a multi-layer photoresist is used resulting in a lower intensity of reflected light and/or (2) because the pattern is finer, resulting in a lower intensity of light reflected by a ridge or score of an alignment mark which is too low or shallow, respectively.

SUMMARY OF THE INVENTION

It is a principal object of the present invention to provide an object position detecting device wherein an accurate position detection is effected by removing measurement error which otherwise may be caused by the use of a scanning means.

It is another object of the present invention to provide an object position detecting device wherein the light energy reaching a photoelectric detecting means is increased by enhancing the illumination efficiency of the illumination light to the object.

It is a further object of the present invention to provide an object position detecting device which is capable of detecting an object having a low reflection factor by increasing a light signal level by an analog superimposition of the amounts of the light reaching an image sensor by the use of the light accumulation function of an image sensor.

These and other objects, features and advantages of the present invention will become more apparent from the following description of the preferred embodiment of the present invention when taken in conjunction with the accompanying drawings.

DESCRIPTION OF THE PREFERRED EMBODIMENT

Figure 1:
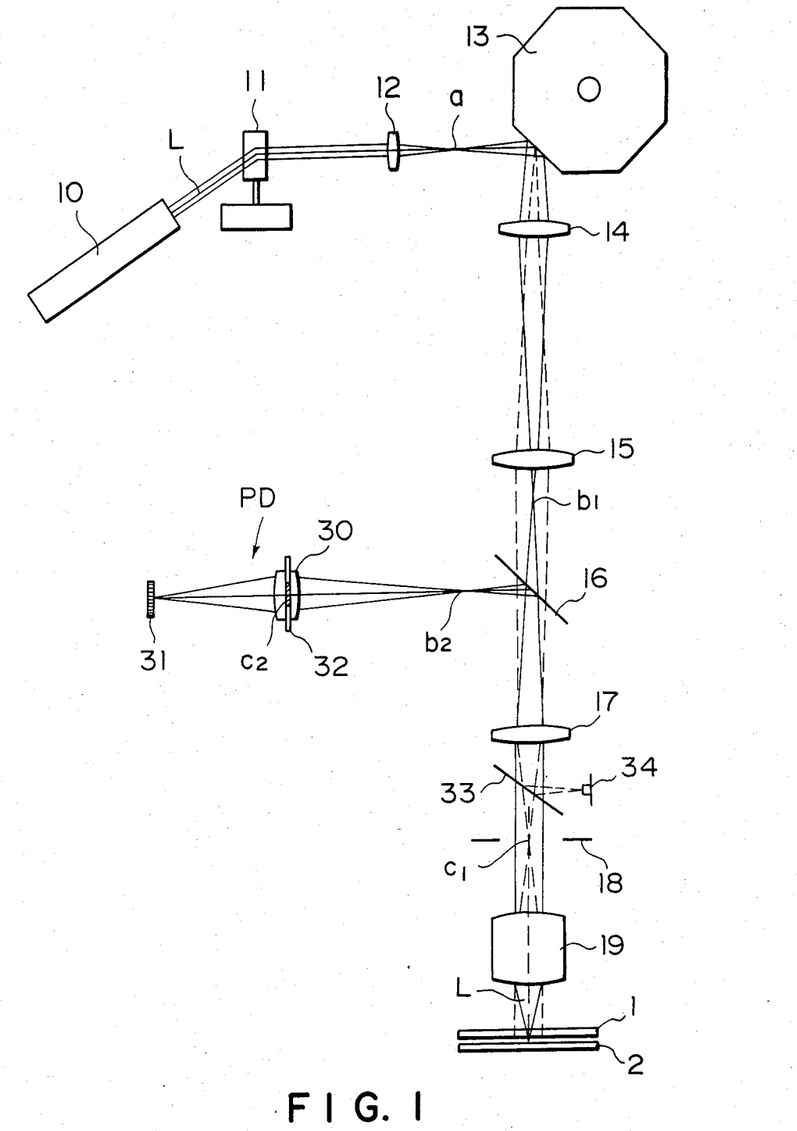
FIG. 1 schematically shows an optical system of an object position detecting device according to an embodiment of the present invention.
Figure 2:
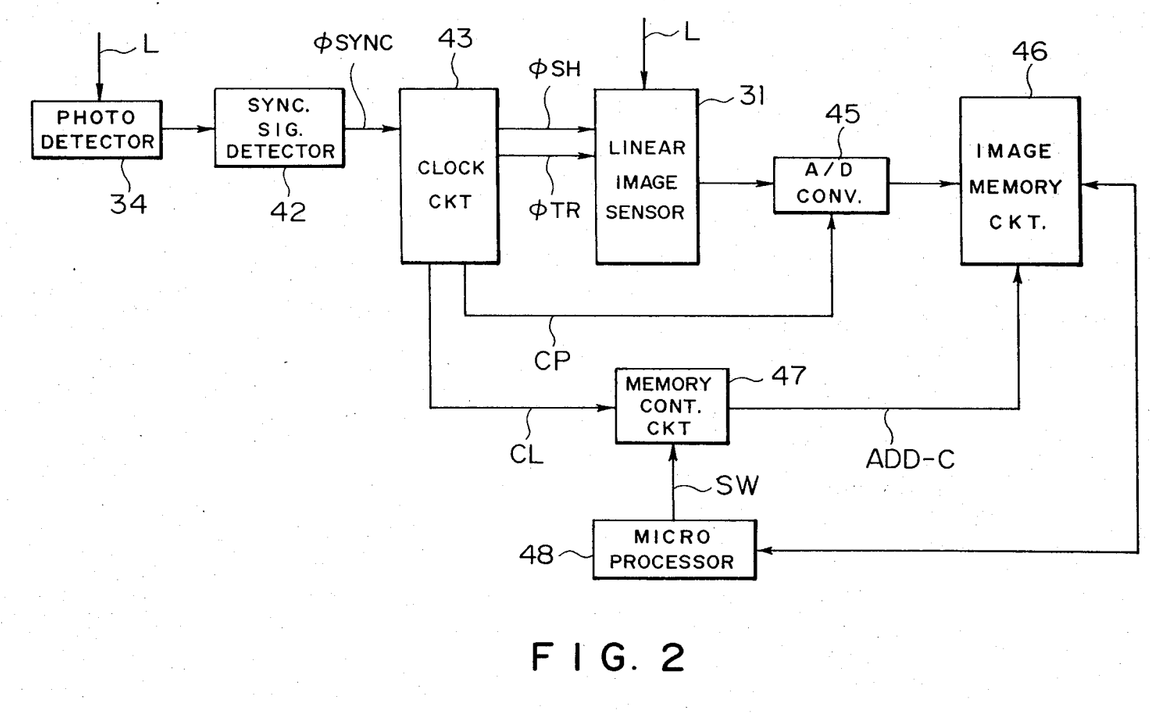
FIG. 2 shows a block diagram of an electric system used with the embodiment shown in FIG. 1.

Referring now to FIGS. 1 and 2, there is shown a preferred embodiment of an optical system of the object position detecting device according to the present invention.

The device shown in FIG. 1 is a position detecting optical system for a proximity type alignment and exposure apparatus in a semiconductor circuit manufacturing machine. The apparatus includes a radiation energy source, such as a laser beam source 10, which emits a laser beam L. Along the optical path of the laser beam L, there are provided a galvanomirror 11, condenser lens 12 and a polygonal mirror 13. Further along the optical path of the laser beam L, as deflected by the polygonal mirror 13, there are provided a relay lens 14, a field lens 15, a beam splitter 16 for splitting a beam reflected by the object out to an optical system PD for photodetection (to be described in detail hereinafter), a relay lens 17, a beam splitter 33 for splitting the beam deflected by the polygonal mirror 13 out to a photodetector 34, and an aperture stop 18 and an objective lens 19 which constitute a telecentric optical system. The laser beam L, transmitted through the objective lens 19, is incident on the mask 1 and the wafer 2, which are disposed proximate to each other. For the photodetector 34, a photoelectric transducer element, such as a phototransistor, may be used. Alternatively, the beam splitter 33 and the photodetector 34 may be replaced by a combination of a light emitting element and a light receiving element disposed adjacent the polygonal mirror 13. This produces, in response to each of the mirror surfaces of the polygonal mirror 13, that is for each scan, a signal which is used as a synchronization signal. Along the optical path of the laser beam L, which has been reflected by the mask 1 and/or the wafer 2 and then split out by the beam splitter 16, there is provided an erector lens 30, a dark field stop 32 for blocking non-scattered light and passing scattered light, and a linear image sensor 31 which constitute a photoelectric detection optical system PD. The linear image sensor 31 includes a solid state image pick-up element, such as a CCD (Charge Coupled Device) image sensor and MOS image sensor, which has a number (in this embodiment 3648) of light receiving elements arranged in one dimension. Image sensors of these types include individual light receiving elements which are produced by the process of semiconductor photolithography. The position of each of these light receiving elements is very precisely determined. Therefore, they are suitable for a position detecting sensor used with an alignment and exposure apparatus for manufacturing semiconductor circuits, which requires such precise alignment. The apparatus may further include an observation optical system which allows observation by human eyes, a beam detector for providing a scan start signal for the polygonal mirror 13, or other features, which are omitted for the sake of simplicity of explanation.

In operation, the laser beam L emitted from the laser beam source 10 is deflected by the galvano-mirror 11, condensed to a point shown by reference a by the condenser lens 12, and thereafter reaches the polygonal mirror 13, wherein it is deflected by approximately 90° to scan in the direction of the polygonal mirror 13 rotation. The deflected beam L passes through the relay lens 14 and the field lens 15, condenses to a point shown by a reference b1, passes through the beam splitter 16 and the relay lens 17, and thereafter reaches the beam splitter 33. The beam is partly reflected by the beam splitter 33, and the reflected beam L is detected by a photodetector 34, which produces an output. The output is amplified and reformed by a synchronization signal detector circuit 42 (shown in FIG. 2), to produce a high level synchronization signal $\phi$SYNC during the time the laser beam L scans the mask 1 and the wafer 2 (time $T_1$ in FIG. 3).

The part of the laser beam L which is passed through the beam splitter 33, is incident on the objective lens 19, such that the principal ray of the laser beam L passes through the focal point $C_1$ of the objective lens 19, located at the center of the stop 18. Since the principal ray of the laser beam L passes through the focal point $C_1$ of the objective lens 19, the laser beam, after passing through the objective lens 19, is parallel with the optical axis thereof, so that the principal ray incident on the mask 1 and the wafer 2 is normal thereto. The laser beam L, incident on the mask 1 and the wafer 2, is imaged by the objective lens 19 as a fine spot or a thin bar, which scans the mask 1 and wafer 2 in scanning direction A as shown in FIG. 4(a), in accordance with the polygonal mirror 13 rotation.

Figure 4:
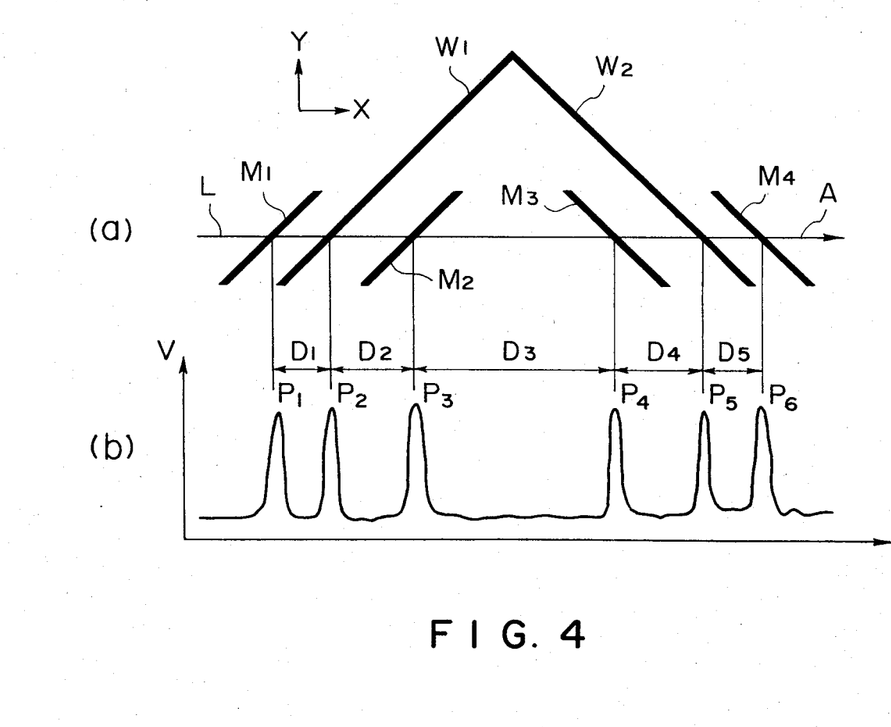
FIG. 4(a) is plan view of the alignment marks formed on a mask and a wafer shown in FIG. 1.
FIG. 4(b) shows the electronic output produced by the alignment marks shown in FIG. 4(a)

FIG. 4(a) shows an alignment mark formed on the mask 1, which includes mark elements $M_1$, $M_2$, $M_3$ and $M_4$. Mark elements $M_1$ and $M_2$ are parallel with each other, and mark elements $M_3$ and $M_4$ are parallel. Mark elements $M_1$ and $M_4$ are perpendicular to each other, as are mark elements $M_2$ and $M_3$. FIG. 4(a) also shows an alignment mark formed on the wafer 2, as a projection or recess, which includes mark elements $W_1$ and $W_2$. It is noted here that the mask 1 and the wafer 2 are already roughly aligned by a prealignment process, as shown in FIG. 4(a), before the mask 1 and the wafer 2 are subjected to the precise alignment operation under the objective lens 19 of the optical system shown in FIG. 1.

When the laser beam L emergent from the objective lens 19 is incident on a specular surface, i.e. other than the alignment marks $M_1$, $M_2$, $M_3$, $M_4$, $W_1$ or $W_2$ of the mask 1 and wafer 2, the beam reflected by the specular surface is not scattered and traces back the path, along which it has reached the mask 1 and wafer 2. That is, it passes back through the focal point $C_1$ of the objective lens 19, at and adjacent the entrance pupil thereof, and through the relay lens 17 to the beam splitter 16. However, when the laser beam is incident on the non-specular surface, namely when the laser beam L is incident on the alignment mark elements $M_1$, $M_2$, $M_3$, $M_4$, $W_1$ or $W_2$, the laser beam L is scattered by the non-specular surface, i.e. the edges of the alignment marks. The scattered beam does not trace the route shown by the broken lines in FIG. 1. That is, the scattered laser beam L does not pass through the center of the entrance pupil, i.e. the focal point $C_1$, after it passes back through the objective lens 19, rather it passes through the marginal area of the entrance pupil. This means that the reflected beam is spatially separated into scattered light and non-scattered light.

The light which has not been scattered when reflected by the specular surface of the mask 1 and the wafer 2, is directed through the relay lens 17 to the beam splitter 16 so that it is imaged at the point b1 after passing the entrance pupil position. The beam splitter 16 splits the laser beam into a beam which is perpendicularly deflected and directed to the photoelectric detection optical system PD, and a beam which passes therethrough to the polygonal mirror 13. The beam deflected toward the photoelectric detection optical system PD is blocked by the dark field stop 32 which is disposed at a position $C_2$, conjugate with the focal point $C_1$ of the objective lens 19.

On the contrary, the laser beam scattered by the alignment marks on the mask 1 and/or wafer 2, as shown by the solid lines in FIG. 1, goes back similarly, but it is imaged at a point b2 which is conjugate with focal point b1 of the relay lens 17. Thereafter it passes through the stop 32, and is imaged on the linear image sensor 31 by the erector lens 30. In this manner, the scanning laser beam L is imaged on the sensor 31 in one dimension, only when the laser beam L is incident on the alignment mark elements $M_1$, $M_2$, $M_3$, $M_4$, $W_1$ or $W_2$. When required by the nature of the alignment mark, a light field stop may be used, in place of the dark field stop 32, wherein the light field stop passes the non-scattered light, but blocks the scattered light.

The linear image sensor 31 includes 3648 bits of light receiving elements arranged in one linear direction. These light receiving elements, which correspond to alignment mark elements, $M_1$, $M_2$, $M_3$, $M_4$, $W_1$ and $W_2$ as will be explained indetail hereinafter, detect such mark elements, respectively. It is a matter of course that, with the increase of the number of the light receiving elements, the precision of the measurement or detection is increased.

Explanation will be made with respect to the processing of the information detected by the linear image sensor 31 in timed relation with the photodetector 34, in conjunction with FIGS. 2, 3, 4(a) and 4(b). FIG. 2 shows a block diagram of the electric control system for the embodiment shown in FIG. 1.

It is assumed that the length of scan by the laser beam L over the mask 1 and the wafer 2 is, for example, 180μ (that is, the distance in FIG. 4(a) through which the laser beam L scanning in the direction A moves across the alignment mark elements $M_1$, $W_1$, $M_2$, $M_3$, $W_2$ and finally $M_4$ is 180μ). Then, the positional information given by one light receiving element (one bit) of the sensor 31 corresponds to 0.05μ ($\cong$180 μ/3648). Therefore, a video output signal of the linear image sensor 31 corresponds to the information of the laser beam scattered by the alignment mark elements $M_1$, $W_1$, $M_2$, $M_3$, $W_2$ or $M_4$ on the mask 1 or wafer 2. That is, it represents directly the position of a mark element, and one bit corresponds to 0.05μ measured on the mask 1 and/or wafer 2. The overall magnification between the alignment marks and the image thereof on the linear image sensor 31, which is the product of the magnifications of the objective lens 19, the relay lens 17 and the erector lens 30, is to be determined on the basis of the dimension of one light receiving element of the linear image sensor 31. For example, when the width of one light receiving element (one bit) is 10μ, the overall magnification is 200 (=10 μ/0.05μ).

Figure 3:
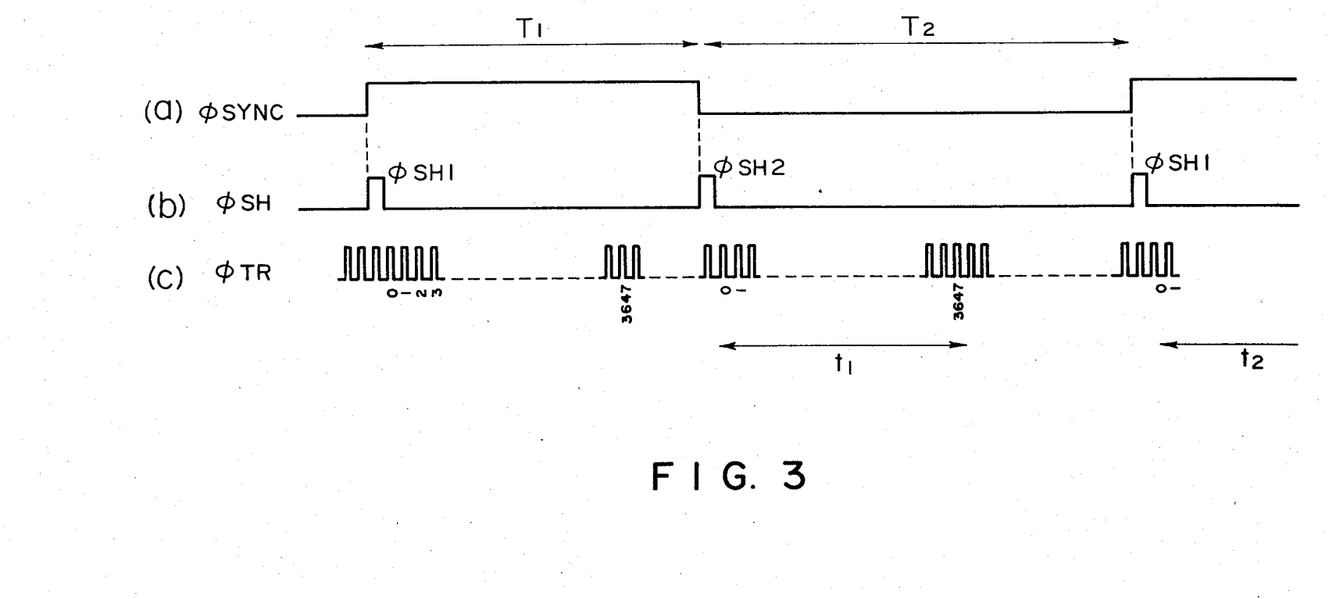
FIG. 3 is a chart showing the operational timings of the electric system shown in FIG. 2.

Referring now to FIG. 2, the photodetector 34 continues applying its output signal, during the time of one scan (in the direction A) of the mask 1 and the wafer 2 by the laser beam, to a synchronization signal detecting circuit 42, which amplifies and reforms the output signal to produce a high level synchronization signal φSYNC (during the time $T_1$ in FIG. 3(a)).

The electric system includes a clock circuit 43 which produces, on the basis of the aforesaid synchronization signal φSYNC and the reference signal produced by quartz crystal vibration in the clock circuit 43, shift signals φSHn and transfer signals φTR which are used to drive the image sensor 31, as shown in FIGS. 3(b) and 3(c).

The shift signals φSH1 and φSH2 are produced at the leading and trailing edges of the synchronization signal φSYNC, respectively, and they drive the linear image sensor 31 to shift the charge accumulated in the light receiving portion thereof to an analog shift register of a transferring portion thereof. The period of scan by the laser beam L (the time duration of ($T_1+T_2$) of FIG. 3(a)) and the scanning time (the time duration $T_1$ of FIG. 3(a)), are determined on the basis of the number of the mirror surfaces of the polygonal mirror 13 and the rotational speed thereof. For example, assuming that ($T_1+T_2$) is equal to 2.5 msec., and $T_1$ is equal to 0.5 msec., the time between the signals φSH1 and φSH2 and the time between the signals φSH2 and the next φSH1, are 0.5 msec. and 0.2 msec., respectively.

The transfer signal φTR, having for example 3700 pulses (it has to be greater than the number of bits of the linear image sensor 31, i.e., 3648 in this embodiment), is produced during the shift signals φSH1 and φSH2. The transfer signal φTR effects the transfer from the analog shift register, the charge which has been shifted to the analog shift register by the shift signal φSH, to an adjacent shift register. The period of the transfer signal φTR is 0.135 micro sec. ($\cong$0.5 msec./3700 pulses), and the frequency is 7.4 MHz. The numerals given under the signal φTR of FIG. 3(c) are bit numbers of the output video signals of the linear image sensor 31, thus showing the 0th bit, first bit . . . 3647th bit after the shift signal φSH is produced. The time periods shown by reference $t_1$ and $t_2$ in FIG. 3(c) are the periods from 0th bit to 3647th bit after the shift signal φSH2 is produced and after the shift signal φSH1 is produced, respectively.

In operation, when laser beam L is scanning the mask 1 and the wafer 2 (time period $T_1$), the light information is accumulated as electric charge in the light receiving portion of the linear image sensor 31 at positions corresponding to the mark elements $M_1$, $M_2$, $M_3$, $M_4$, $W_1$ and $W_2$, and the charge is shifted to the analog shift register by the shift signal SH2. Then, during time $t_1$ (FIG. 3(c)), the charge is read out in response to the transfer signals φTR.

During the time $T_2$, when no laser beam is incident on the mask 1 or the wafer 2, no light is received by the linear image sensor 31. However, in order to prevent possible deterioration of the S/N ratio which may be caused by the dark current of the sensor 31, the charge information stored during the time $T_2$ is preferably read out as a dummy signal.

The output video signal read out of the linear image sensor 31 is digitalized by an A/D converter 45 shown in FIG. 2. The A/D converter 45 is an 8-bit flash type high speed converter. As for the conversion operation timings, conversion command pulses CP having the same period as the transfer signals φTR of the sensor 31 and having a phase different therefrom, are applied from the clock circuit 43.

The system further includes an image memory circuit 46 having a random access memory (RAM) consisting of 8-bit×4096, which stores the data transferred from the A/D converter 45. A memory control circuit 47 is controlled by a microprocessor 48, which applies a switching signal SW to the memory control circuit 47 when the data is written in the image memory circuit 47 and when the microprocessor 48 reads the data out.

When the data is written in, the memory control circuit 47 applies from the clock circuit 43, directly to the image memory circuit 46, on the basis of the clock signals CL, an address and control signal ADD-C (read/write signals, chip selection signals). At this time, therefore, the image memory circuit 46 operates independent of the microprocessor 48, under the control of DMA (Direct Memory Access). In this manner, the video signals from the linear image sensor 31 are digitalized by the A/D converter 45, and stored in the image memory circuit 46 as 8-bit data.

When, on the other hand, the data is to be read out, the microprocessor 48 applies a switching signal SW to the memory control circuit 47 so that the address and control signal ADD-C is applied to the image memory circuit 46 via the memory control circuit 47, to directly read out and process the data stored in the manner aforementioned.

As explained hereinbefore, the peaks $P_1$ to $P_6$ (FIG. 4(b)) of the linear image sensor 31 output signals, corresponding to the alignment mark elements $M_1$, $W_1$, $M_2$, $M_3$, and $W_2$ and $M_4$ of the alignment marks of FIG. 4(a), directly correspond to the positions of the mark elements, so that the addresses in the image memory circuit 46 correspond to the positions of the mask 1 and wafer 2. More particularly, one address in the image memory circuit 46 corresponds to 0.05μ on the mask 1 or the wafer 2. The data thus provided can be processed by the microprocessor 48. For example, the deviation or displacement of ΔX in the direction X between the mask 1 and the wafer 2, and the deviation or displacement ΔY between the same in the Y direction, are expressed by, $$\Delta X = (D_1 + D_2 - D_4 - D_5)/4$$

$$\Delta Y = (-D_1 + D_2 - D_4 + D_5)/4$$

where $D_1$ is the distance between $P_1$ and $P_2$; $D_2$ is the distance between $P_2$ and $P_3$; $D_3$ is the distance between $P_3$ and $P_4$; $D_4$ is the distance between $P_4$ and $P_5$; and $D_5$ is the distance between $P_5$ and $P_6$ (see FIG. 4(b)).

As for the method of obtaining the peaks $P_1$ to $P_6$, it is possible that the data is binary-coded, and the center of the pulse is determined. Alternatively, the maximum of the pulse form may be determined as the peak. Another alternative is that an approximate curvature of the pulse form may be determined, and the center of the peak is then determined on the basis of the approximate curvature. Other methods are also possible.

Figure 5:
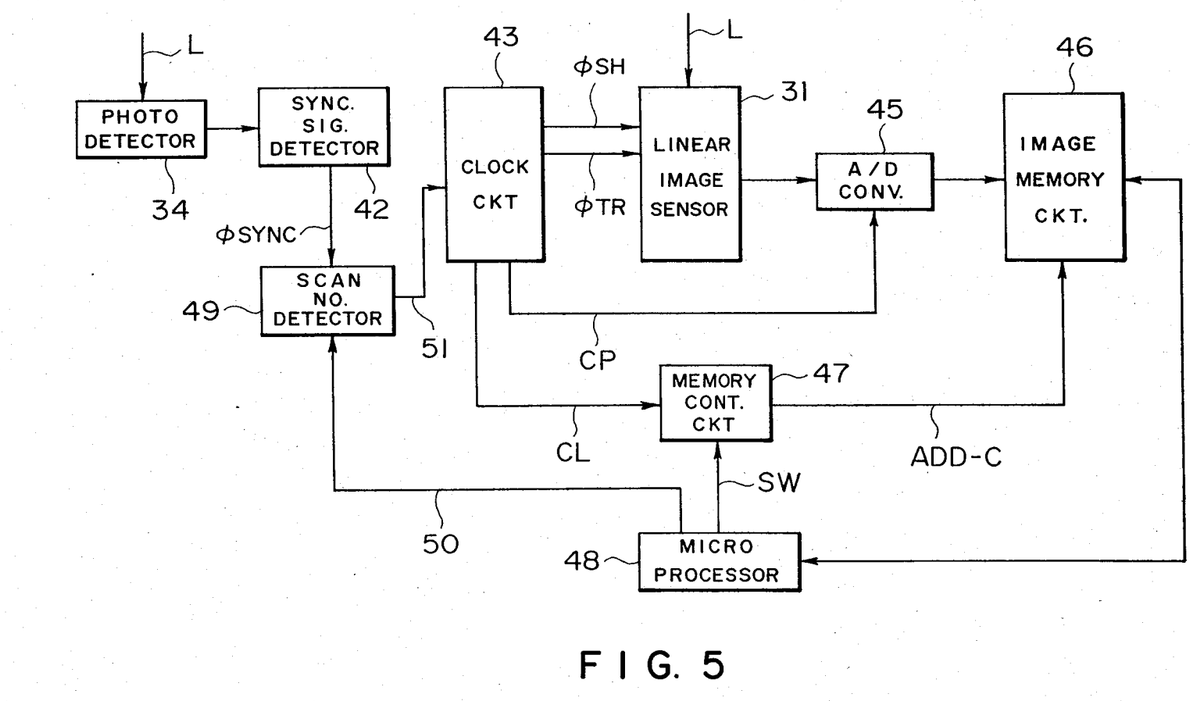
FIG. 5 schematically shows an electric control system used in an object position detecting device according to another embodiment of the present invention.

FIG. 5 shows another embodiment of an electric control system which is usable with the optical arrangement shown in FIG. 1.

This embodiment is suitable particularly when the beam reflected by the mask 1 or the wafer 2 is not strong. This embodiment employs as the image sensor 31 (FIG. 1) a light accumulation type image sensor, such as CCD or the like, which itself has the function of adding the amounts of light. The electric circuit shown in FIG. 5 differs from FIG. 2 in that it includes a circuit 49. The circuit 49 detects the number of scanning operations, and includes a counting circuit for counting the sychronization signals φSYNC produced by the synchronization signal detecting circuit 42, a register circuit for setting the number of scanning operations instructed by the microprocessor 48, and a comparison circuit for comparing the counts of the counting circuit and the number of scanning operations set in the circuit.

One function of the scanning number detecting circuit 49 is to detect, after a start signal is given by the microprocessor 48, the leading edge of the first synchronization signal φSYNC and produce a shift signal to the clock circuit 43 through the signal line 51. A second function is to compare the number of scanning operations, that is, the number of synchronization signals φSYNC counted by the counting circuit, with the number set in the register circuit by the microprocessor 48, to detect, after the count number becomes equal to the set number, the trailing edge of the synchronization signal φSYN, and to produce a shift instruction signal to the clock circuit 43.

Figure 6:
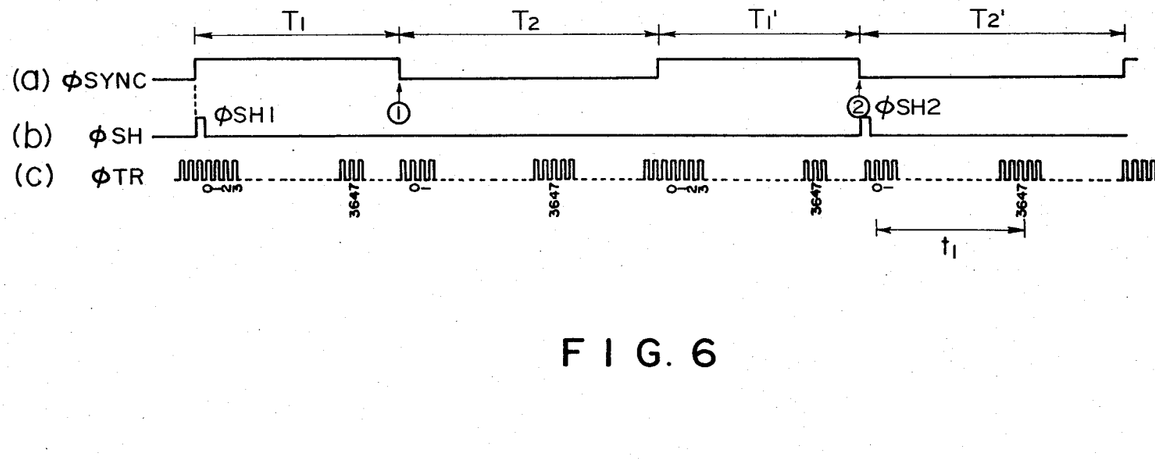
FIG. 6 is a chart showing the operational timings of the electric control system shown in FIG. 5.

When the shift instruction signal is produced, the clock circuit 47 produces shift signals φSH and transfer signals φTR for driving the image sensor 31, (as shown in FIGS. 6(b) and 6(c), on the basis of the synchronization φSYNC and the reference signal of the quartz crystal vibration in the clock circuit 47. The shift signals φSH contain a signal φSH1 and a signal φSH2 as shown in FIG. 6, which correspond to the shift instruction signal upon the leading edge of the synchronization signal and the shift instruction signals upon the trailing edge thereof, respectively. In response to either of the signals φSH1 and φSH2, however, the charge stored in the light receiving portion of linear image sensor 31 is shifted to the analog shift register of the transferring portion.

The operation of the present invention, when the number of scanning operations is two, will be described in conjunction with FIGS. 5 and 6.

1. The microprocessor 48, through the signal line 50, sets the number of scanning operations to be effected (ie two) in the register circuit of the scanning number detecting circuit 49, and produces a start instruction.

2. The scanning number detecting circuit 49 detects the leading edge of the first synchronization signal φSYNC after the production of the start instruction signal, outputs a shift instruction signal to the clock circuit 43, and simultaneously therewith clears the scanning number counting circuit 49.

3. The clock circuit 43, in response to the shift instruction signal 51, outputs a shift signal φSH1 to the linear image sensor 31.

4. The linear image sensor 31, in response to the shift signal φSH1 starts accumulation.

The laser beam performs a first scan, wherein the period of scan by the laser beam L (the time duration of $(T_1 + T_2)$ of FIG. 3(a)) and the scanning time (the time duration $T_1$ of FIG. 3(a)), are determined on the basis of the number of mirror surfaces of the polygonal mirror 13 and the rotational speed thereof. For example, assuming that $(T_1 + T_2)$ is equal to 2.5 msec., and $T_1$ is equal to 0.5 msec., then the time $T_2 = 2.0$ msec.

5. The scanning number detecting circuit 49 detects the trailing edge of the synchronization signal φSYNC, as shown by ① in FIG. 6, and in response thereto, counts up the counter circuits (count = 1).

6. Upon the trailing edge of the synchronization signal φSYNC in the next scan, the scanning number counting circuit counts up to 2 (shown by ② in FIG. 6), so that the count becomes equal to the number set in the register circuit, and then a shift instruction signal is produced.

7. The shift instruction signal makes the clock circuit 43 output a shift signal φSH2 to the linear image sensor 31.

8. Thus, in the light receiving portion of the accumulation type linear sensor 31, a sum of the pieces of image information of the object to be sensed during the shift signals φSH1 and φSH2, i.e., during the two scanning operations in the period $T_1$ plus $T_1'$, are stored.

9. The image information stored in the light receiving portion is shifted to the analog shift register of the transferring portion from the light receiving portion in response to the shift signal φSH2.

10. The image information shifted to the analog shift register, is transferred to the A/D converter 45 in response to the transfer signals φTR during the period shown by $t_1$ in FIG. 6.

The transfer signal φTR, having for example 3700 pulses (it has to be greater than the number of bits of the linear image sensor 31, i.e., 3648 in this embodiment) is produced during the scanning period $T_1$. The transfer signal φTR effects the transfer, from the analog shift register, the charge which has been shifted to the analog shift register by the shift signal φSH, to an adjacent shift register. The period of the transfer signal φTR is 0.135 micro sec. ($\simeq 0.5$ msec./3700 pulses), and the frequency is 7.4 MHz. The numerals given under the signal φTR of FIG. 6(c) are bit numbers of the output video signals of the linear image sensor 31, thus showing the 0th bit, first bit . . . 3647th bit after the shift signal φSH is produced.

11. The output video signal read out from the linear image sensor 31 is digitalized by the A/D converter 45 shown in FIG. 5.

The A/D converter 45 is an 8-bit flash type high speed converter. As for the conversion operation timings, conversion command pulses CP having the same period as of the transfer signals φTR of the sensor 31 and having a phase different therefrom, are applied from the clock circuit 43. The steps of writing the data from the A/D converter 45 into the memory circuit 46, reading it out, and processing the data to obtain the distance between the alignment mark elements, are the same as those which have been made hereinbefore in conjunction with FIG. 2.

Figure 7:
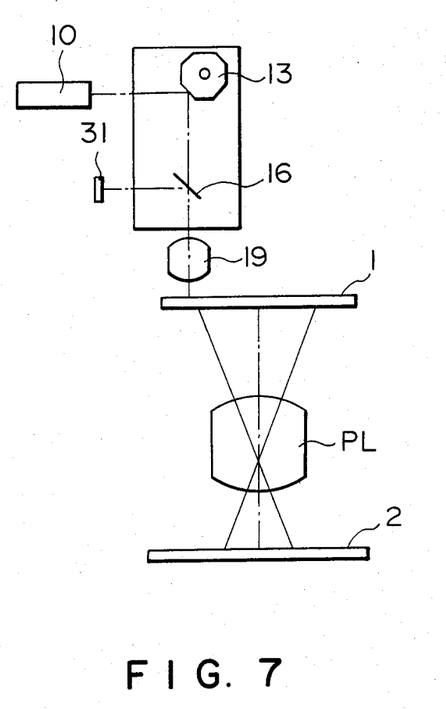
FIG. 7 schematically shows an optical system of an object position detecting device according to a further embodiment of the present invention.

FIG. 7 shows another type of alignment and exposure apparatus for manufacturing semiconductor circuits to which the present invention is applicable. This is the so-called reduction production type alignment and exposure apparatus, wherein a semiconductor circuit pattern of the mask 1 is projected by the projection lens PL onto the wafer 2 at a reduced magnification to expose the wafer 2 to the pattern. For the detection of the alignment marks which are similar to that explained above, the alignment marks are scanned with the laser beam produced by the laser source 10. The laser beam produced by the laser source is scanningly deflected by the polygonal mirror 13, to scan the mask alignment mark through the objective lens 19, and to scan the wafer alignment mark through the projection lens PL. The beam reflected by the alignment marks is deflected by the beam splitter 16 and directed to the linear image sensor 31. The present invention operates in to this type of alignment and exposure apparatus in a manner similar to that explained in the foregoing paragraphs.

The foregoing embodiments primarily relate to a so-called proximity type alignment and exposure apparatus for semiconductor circuits manufacturing, wherein the mask 1 and the wafer 2 are placed in proximity with each other. However, the present invention is applicable to an alignment and exposure apparatus of a contact type, a mirror projection type wherein a projection optical system is provided between the mask and wafer, a reduction projection type (step-and-repeat type) wherein a projection lens as shown in FIG. 7 is used to project an image of a pattern of a mask onto the wafer, or other semiconductor circuits manufacturing apparatus which require an accurate alignment. Further, the present invention is not limited to the alignment mark shown in FIG. 4(a), but can be used with other type of alignment marks.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for detecting a position of an object, comprising:
    means for producing a light beam;
    means for scanningly deflecting said beam with respect to the object;
    means for sensing an image of said object resulting from the scan and accumulating information therefrom as an electric signal;
    means for outputting said signal from said sensing and accumulating means when the scan is complete; and
    means for detecting the position of the object on the basis of said signal output from said sensing and accumulating means.

2. An apparatus according to claim 1, wherein said accumulating and sensing means starts the accumulation of the information in response to the start of the scan.

3. An apparatus according to claim 1, wherein said outputting means counts the number of scans by said beam, and wherein when the number of scans reaches a predetermined amount, said outputting means outputs said signal.

4. An apparatus according to claim 1, wherein said detecting means digitalizes the signal output from said accumulating and sensing means and detects the position of the object on the basis of the digital signal.

5. An apparatus according to claim 1, wherein said accumulating and sensing means further comprises plural sensing elements disposed in an image plane of the object, and wherein said outputting means outputs the signals produced by said sensing elements in a timed series.

6. An apparatus according to claim 5, wherein said outputting means outputs the signal for each of the sensing elements from said accumulating and sensing means between the time when said deflecting means completes the scan and the time when it starts the next scan.

7. An apparatus according to claim 6, wherein said detecting means further comprises a converter for digitalizing the signal from each of said sensing elements and a memory for storing the digital signals corresponding to the respective sensing elements.

* * * * *